US008637843B2

(12) United States Patent
Asano

(10) Patent No.: US 8,637,843 B2
(45) Date of Patent: Jan. 28, 2014

(54) SEMICONDUCTOR DEVICE INCLUDING PHASE CHANGE MATERIAL AND METHOD OF MANUFACTURING SAME

(76) Inventor: Isamu Asano, Tokyo (JP)

( * ) Notice: Subject to any disclaimer, the term of this patent is extended or adjusted under 35 U.S.C. 154(b) by 91 days.

(21) Appl. No.: 13/370,693

(22) Filed: Feb. 10, 2012

(65) Prior Publication Data
US 2012/0211715 A1    Aug. 23, 2012

(30) Foreign Application Priority Data

Feb. 21, 2011  (JP) ................................. 2011-034220

(51) Int. Cl.
*H01L 29/02*   (2006.01)
(52) U.S. Cl.
USPC ...... 257/2; 257/4; 257/E21.001; 257/E47.001
(58) Field of Classification Search
USPC ............. 257/2, 4, E21.001, E47.001; 438/95, 438/104, 652
See application file for complete search history.

(56) References Cited

U.S. PATENT DOCUMENTS

| | | | |
|---|---|---|---|
| 7,671,360 B2 | 3/2010 | Sato et al. | |
| 7,906,773 B2 * | 3/2011 | Ko et al. | ............................ 257/2 |
| 7,943,502 B2 | 5/2011 | Park et al. | |
| 2010/0078759 A1 * | 4/2010 | Sekar et al. | .................... 257/530 |
| 2010/0200829 A1 * | 8/2010 | Dennison et al. | ................. 257/3 |
| 2011/0180774 A1 | 7/2011 | Park et al. | |

FOREIGN PATENT DOCUMENTS

| | | |
|---|---|---|
| JP | 2008-71797 A | 3/2008 |
| JP | 2008-311664 A | 12/2008 |

\* cited by examiner

*Primary Examiner* — Jarrett Stark
*Assistant Examiner* — Shahed Ahmed
(74) *Attorney, Agent, or Firm* — Foley & Lardner LLP

(57) ABSTRACT

Disclosed herein is a device that includes: an interlayer insulation film having a through hole; and a phase change storage element provided in the through hole. The phase change storage element includes: an outer electrode being a conductive film of cylindrical shape and being formed along an inner wall of the through hole; a buffer insulation film being an insulation film of cylindrical shape and being formed along an inner wall of the outer electrode, an upper end of the buffer insulation film being recessed in part to form a recess; a phase change film filling an interior of the recess; and an inner electrode being a conductive film formed along an inner wall of the buffer insulation film including a surface of the phase change film.

15 Claims, 10 Drawing Sheets

SEMICONDUCTOR DEVICE INCLUDING PHASE CHANGE MATERIAL AND METHOD OF MANUFACTURING SAME

This application is based on Japanese patent application no. 2011-034220, filed Feb. 21, 2011, the entire contents of which is incorporated herein by reference.

BACKGROUND OF THE INVENTION

1. Field of the Invention

The present invention relates to a semiconductor device and a method of manufacturing the same. In particular, the present invention relates to a semiconductor device that uses phase change storage elements, and a method of manufacturing the same.

2. Description of Related Art

Phase change random access memories (PRAMS) have been known which comprise storage elements each including a phase change material and an upper electrode and a lower electrode (heater electrodes) that are arranged with the phase change material therebetween. Hereinafter, the storage elements of the PRAMs may be referred to as "phase change storage elements". Patent Document 1 (Japanese Patent Application Laid-Open No. 2008-071797) and Patent Document 2 (Japanese Patent Application Laid-Open No. 2008-311664) disclose examples of such a PRAM. In PRAMs, writing on a phase change storage element is performed by passing a write current between upper and lower electrodes and changing a phase of the phase change material with the resulting heat.

The upper electrode is a conductor that constitutes bit lines and is arranged to have an electrical connection with the top surface of the phase change material. The lower electrode is a conductor of pillar shape. As indicated in Patent Documents 1 and 2, the lower electrode is arranged so that its top surface has a close contact with the bottom surface of the phase change material. The bottom surface of the lower electrode is electrically connected to one of two diffusion layers of a cell transistor through a contact plug. The other diffusion layer of the cell transistor is connected to ground wiring. Gate electrodes of the cell transistors constitute word lines. With the foregoing configuration, a PRAM can write and read a phase change storage element at the intersection of a selected word line and a selected bit line.

To increase current density for improved heating efficiency, the contact area between each of the heater electrode (an upper electrode or an lower electrode) and the phase change material is preferably small. The heater electrode and the phase change material are typically formed by stacking them in order inside a through hole formed in an insulation film. According to such a method, the lower limit of the contact areas is determined by the minimum feature size. Therefore, techniques realizing a smaller contact area than the lower limit have been desired.

FIG. 12 of Patent Document 1 and FIG. 10 of Patent Document 2 disclose examples of such techniques. In the examples, a heater electrode is formed in a ring shape and a phase change material is formed thereon in a similar ring shape, thereby reducing the contact area. Furthermore, a technique realizing a reduction of the contact areas by forming a sidewall insulation film inside through holes and thus reducing the diameter of the through holes is under study. However, the foregoing techniques are far from achieving a sufficient reduction in contact area. A technology capable of a further reduction in contact area has thus been desired.

SUMMARY

In one embodiment, there is provided a semiconductor device that includes an interlayer insulation film having a first through hole and a first phase change storage element provided in the first through hole. The first phase change storage element includes: a first outer electrode of a cylindrical shape covering an inner wall of the first through hole; a first buffer insulation film of a cylindrical shape covering an inner wall of the first outer electrode, the first buffer insulation film having a first recess exposing a first portion of the inner wall of the first outer electrode; a first phase change film having one and opposite surfaces, the first phase change film filling the first recess so that the one surface of the first phase change film is in contact with the first portion; and a first inner electrode covering an inner wall of the first buffer insulation film and the opposite surface of the first phase change film.

In another embodiment, there is provided a method of manufacturing a semiconductor device, that includes: forming a first interlayer insulation film; forming a through hole in the first interlayer insulation film; forming an outer electrode of a closed-bottomed cylindrical shape covering an inner wall of the through hole; forming a buffer insulation film of a closed-bottomed cylindrical shape covering an inner wall and bottom wall of the outer electrode; forming an inner electrode covering an inner wall and bottom wall of the buffer insulation film; forming a second interlayer insulation film on the first interlayer insulation film; forming an opening in the second interlayer insulation film, the opening exposing a part of a top surface of the buffer insulation film; etching the buffer insulation film through the opening to form a recess in an upper end of the buffer insulation film; and filling the recess with a phase change film.

In still another embodiment, there is provided a semiconductor device that includes: a semiconductor substrate; an insulation film formed over the semiconductor substrate; a phase change film formed on a top surface of the insulation film, the phase change film having a bottom surface contacting to the insulation film; a first electrode formed on a first side surface of the insulation film and a first side surface of the phase change film; and a second electrode formed on a second side surface of the insulation film and a second side surface of the phase change film.

BRIEF DESCRIPTION OF THE DRAWINGS

FIGS. 1B to 10B are sectional views of the semiconductor device 1 corresponding to a cross section taken along the line A-A of the respective corresponding plan views.

DETAILED DESCRIPTION OF THE EMBODIMENTS

Preferred embodiments of the present invention will be explained below in detail with reference to the accompanying drawings.

Figure 1A:
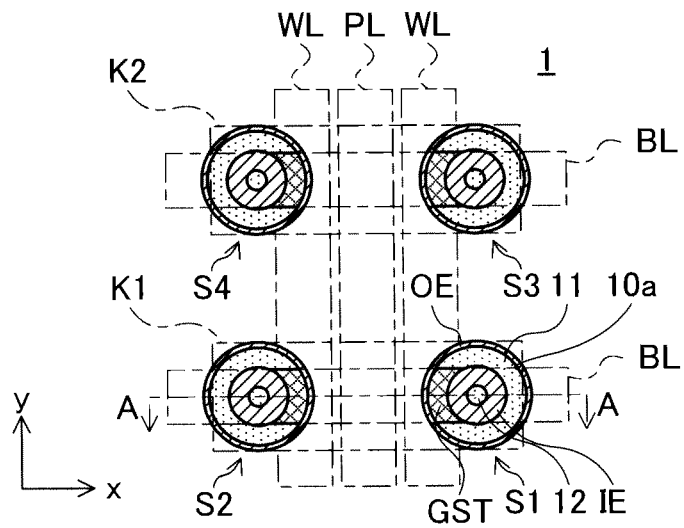
FIGS. 1A, 7A, 8A, and 10A are plan views of a semiconductor device 1.
Figure 1B:
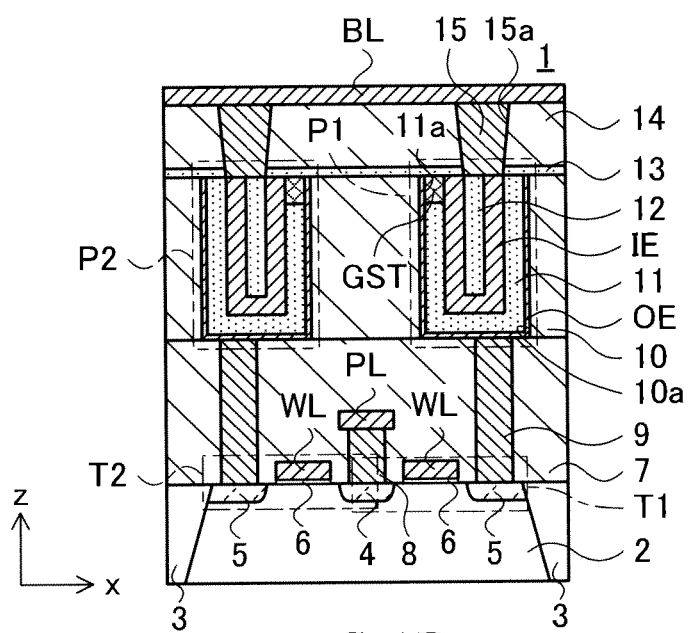

Referring now to FIGS. 1A and 1B which are diagrams showing the configuration of a semiconductor device 1 according to a preferred first embodiment of the present invention. In FIG. 1A, structures other than phase change storage elements to be described later are shown transparent.

The semiconductor device 1 is a semiconductor storage device such as a phase change random access memory (PRAM). The semiconductor device 1 includes a plurality of bit lines BL each extending in an x direction, and a plurality of word lines WL each extending in a y direction (direction orthogonal to the x direction). FIGS. 1A and 1B and subsequent drawings show only two bit lines BL and two word lines WL, whereas the lines are actually arranged in greater numbers.

The semiconductor device 1 includes memory cells which are arranged at respective intersections of the bit lines BL and the word lines WL. FIG. 1A shows only four of the memory cells. In the following description, if need be, the four memory cells may be distinguished in the following way. The memory cell at the bottom right of the diagram may be referred to as a first memory cell S1. The one adjoining the first memory cell S1 in the x direction may be referred to as a second memory cell S2. The one adjoining the first memory cell S1 in the y direction may be referred to as a third memory cell S3. The remaining one may be referred to as a fourth memory cell S4.

Each memory cell includes a phase change storage element and a cell transistor. Hereinafter, a phase change storage element and a cell transistor belonging to an nth memory cell Sn will be referred to as an nth phase change storage element Pn and an nth cell transistor Tn, respectively (n is an integer of 1 to 4). FIG. 1B shows only the first and second phase change storage elements P1 and P2 and the first and second cell transistors T1 and T2.

As shown in FIG. 1B, the semiconductor device 1 includes a monocrystalline substrate (silicon substrate) 2 and element isolation regions 3 which are formed in the surface of the substrate 2. The element isolation regions 3 have portions extending in the x direction and portions extending in the y direction, whereby a plurality of active regions are defined in a matrix configuration. An active region is associated with one bit line BL and two word lines WL, so that each active region includes two memory cells. In the example of FIG. 1A, the first and second memory cells S1 and S2 are included in an active region K1. The third and fourth memory cells S3 and S4 are included in an active region K2 which adjoins the active region K1 in the y direction.

The structure of the memory cells will be concretely described below with reference to FIG. 1B. It should be noted that while the present embodiment deals with a case where the cell transistors are of so-called planar type, the present invention is characterized by the phase change storage element portions and the cell transistors may have any structure. Cell transistors of other types may be used, including three-dimensional cell transistors that are formed by embedding a gate electrode in a substrate groove via a gate insulator.

As shown in FIG. 1B, an active region includes an impurity diffusion region 4 near the center in the x direction, and impurity diffusion regions 5 on both ends in the x direction. The impurity diffusion regions 4 and 5 are formed by implanting impurities having a conductivity type opposite to that of impurities in the substrate 2 into the surface of the substrate 2.

As shown in FIG. 1B, word lines WL are laid on the surface of the substrate 2 between the impurity diffusion regions 4 and 5 through extremely-thin gate insulation films 6. The word lines WL constitute the gates (control electrodes) of the cell transistors. The impurity diffusion regions 4 and 5 constitute ones and the others of the sources and drains (ones and the others of the electrodes to be controlled) of the cell transistors. Cell transistors adjoining in the y direction share a common word line WL as their control electrodes.

In the example of FIG. 1A, the first cell transistor T1 (cell transistor that is included in the first memory cell S1; the same holds for the following) and the third cell transistor T3 adjoin each other in the y direction, and thus share a common word line WL as their control electrodes. Similarly, the second cell transistor T2 and the fourth cell transistor T4 adjoin each other in the y direction, and thus share a common word line WL as their control electrodes.

As shown in FIG. 1B, an interlayer insulation film 7 made of a silicon oxide film is deposited on the surface of the substrate 2. The word lines WL are embedded in the interlayer insulation film 7. Plate wiring PL is also embedded in the interlayer insulation film 7, in a position between the two word lines WL when seen in a plan view. A ground potential is supplied to the plate wiring PL. The plate wiring PL extends in the y direction like the word lines WL as shown in FIG. 1A, and is electrically insulated from the word lines WL. The plate wiring PL is electrically connected to the impurity diffusion regions 4 through contact plugs 8 which are formed in the interlayer insulation film 7. Therefore, the potentials of the impurity diffusion regions 4 are constantly maintained at the ground potential. While the plate wiring PL is arranged above the surface of the substrate 2, the plate wiring PL may be embedded in the substrate 2.

Storage node contact plugs 9 are also formed in the interlayer insulation film 7. The storage node contact plugs 9 are formed with respect to each of the impurity diffusion regions 5 and penetrates through the interlayer insulation film 7. The storage node contact plugs 9 are connected to the corresponding impurity diffusion regions 5 at the bottom, and connected to outer electrodes OE (to be described later) of the corresponding phase change storage elements at the top. As a result, the impurity diffusion regions 5 and the outer electrodes OE of the corresponding phase change storage elements are electrically connected by the storage node contact plugs 9.

An interlayer insulation film 10 made of a silicon oxide film is deposited on the top surface of the interlayer insulation film 7. The phase change storage elements are formed in through holes 10a which pass through the interlayer insulation film 10. Specifically, each phase change storage element is constituted by an outer electrode OE, a buffer insulation film 11, an inner electrode IE, and a fill-in insulation film 12 which are successively stacked in a through hole 10a, and a phase change film GST.

More specifically, the outer electrode OE is a conductive film of closed-bottomed cylindrical shape, formed along the inner wall of the through hole 10a. The buffer insulation film 11 is an insulation film of closed-bottomed cylindrical shape, formed along the inner wall of the outer electrode OE. The upper end of the buffer insulation film 11 is recessed in part to form a recess 11a. The phase change film GST is a phase change material that fills the recess 11a. The inner electrode IE is a conductive film of closed-bottomed cylindrical shape, formed along the inner wall of the buffer insulation film 11 including the surface of the phase change film GST. The fill-in insulation film 12 is an insulation film of pillar shape, formed along the inner wall of the inner electrode IE. A pair of through holes 10a are formed at both longitudinal ends of an active region K whose longitudinal direction is the x direction. Recesses 11a are formed in part of the buffer insulation films 11 on sides where the pair of through holes 10a face each other. The recesses 11a, i.e., the phase change films GST are located to at least overlap a line that connects the centers of the pair of through holes 10a.

As employed in the present invention, a "cylindrical shape" refers to a three-dimensional shape that is obtained by stacking planar shapes having a space inside in their normal direction. The "cylindrical shape" has a bottom, a top, and sides. The top is not closed. The bottom may be closed or unclosed. The former configuration will be referred to as a "closed-bottomed cylindrical shape," and the latter a "bottomless cylindrical shape." As employed in the present invention, a "generally cylindrical shape," "closed-bottomed generally cylindrical shape," and "bottomless generally cylindrical shape" refer to the three-dimensional configurations of a "cylindrical shape," "closed-bottomed cylindrical shape," and "bottomless cylindrical shape" with a recess in part of the upper end, respectively. As employed in the present invention, a "pillar shape" refers to a three-dimensional shape that is obtained by filling the internal space of a "cylindrical shape" with the same material as that constituting the "cylindrical shape."

The width of the phase change film GST in the y direction is preferably determined to minimize the contact area with the outer electrode OE. In the present embodiment, the width in the y direction is the minimum feature size which is defined by lithography. For example, the phase change film GST may have a width of 40 nm in the y direction. In the semiconductor device 1, the contact area between the outer electrode OE and the phase change film GST can also be adjusted by adjusting the depth of the recess 11a. Such an adjustment is made possible because the phase change film GST and the outer electrode OE contacts with each other in the lateral direction.

An interlayer insulation film 13 made of a silicon nitride film and an interlayer insulation film 14 made of a silicon oxide film are stacked in order on the top surface of the interlayer insulation film 10. Bit lines BL are formed on the top surface of the interlayer insulation film 14. As shown in FIG. 1B, bit line contact plugs 15 are formed in the interlayer insulation films 13 and 14 so as to correspond to the respective memory cells. The inner electrode IE of each memory cell is electrically connected to a bit line BL through a bit line contact plug 15. A plurality of bit line contact plugs 15 adjoining in the x direction are in contact with a common bit line BL at the top. The inner electrodes IE of memory cells adjoining in the x direction are thus electrically connected to a common bit line BL.

In the example of FIG. 1A, the first phase change storage element P1 and the second phase change storage element P2 adjoin each other in the x direction, so that their inner electrodes IE are connected to a common bit line BL. Similarly, the third phase change storage element P3 and the fourth phase change storage element P4 adjoin each other in the x direction, so that their inner electrodes IE are connected to a common bit line BL.

Next, the operation of the semiconductor device 1 having the foregoing structure will be described. The following description deals with the case of reading and writing the first memory cell S1. The same operation is applied to the other memory cells.

Initially, the word line WL corresponding to the first memory cell S1 is activated. The first cell transistor T1 is thereby turned ON, and the first outer electrode OE (the outer electrode OE of the first phase change storage element P1) is electrically connected to the plate wiring PL. As a result, the ground potential is supplied to the first outer electrode OE.

Next, the bit line BL corresponding to the first memory cell S1 is supplied with a predetermined potential. Here, different potentials are supplied for reading and for writing. Specifically, in the case of reading, a relatively low potential is supplied such that the first phase change film GST (the phase change film GST of the first phase change storage element P1) causes no phase change. After the supply of the potential, the bit line BL falls slightly in potential because of a current that flows from the first inner electrode IE (the inner electrode IE of the first phase change storage element P1) to the first outer electrode OE through the first phase change film GST. The degree of fall depends on the resistance of the first phase change film GST. Specifically, if the first phase change film GST is in a crystalline phase of relatively low resistance, the potential of the bit line BL falls more than in an amorphous phase of relatively high resistance. Such a difference in the amount of fall is detected to read the phase state of the first phase change film GST.

In the case of writing, a relatively high potential such that the first phase change film GST causes a phase change is supplied. The increased potential is lowered over different durations in a reset operation and in a set operation. A reset operation is to change the first phase change film GST into a high resistance state. A set operation is to change the first phase change film GST into a low resistance state. Specifically, in a reset operation, the increased potential is relatively sharply restored to zero. As a result, the first phase change film GST is rapidly cooled into an amorphous phase of high resistance. On the other hand, in a set operation, the increased potential is relatively slowly restored to zero. As a result, the first phase change film GST is gradually cooled into a crystalline phase of low resistance. In such a way, the potential fall time is controlled to write a desired phase state into the first phase change film GST.

As has been described above, according to the semiconductor device 1, the phase change film GST is formed not on the entire upper end of the cylindrical buffer insulation film 11 but only in part. Further, since the phase change film GST and the outer electrode OE, which serves as a heater electrode, contacts with each other in the lateral direction, the contact area between the outer electrode OE and the phase change film GST can be freely adjusted by adjusting the depth of the recess 11a. This allows reduction of the contact area between the heater electrode and the phase change material.

Also, because the buffer insulation film 11 is formed in a ring shape when seen in a plan view, and the recess 11a is formed only in part of the buffer insulation film 11, and the phase change film GST is filled and enclosed in the recess 11a, the phase change area of the phase change film GST is confined within an extremely small space. This makes it possible to avoid a problem that the characteristics of the phase change area varies due to deterioration with age under repetitive operations.

Also, the semiconductor device 1 includes the fill-in insulation film 12, and the inner electrode IE has an accordingly smaller volume. This suppresses the heater sink effect of the inner electrode IE, and thus the heating efficiency is improved.

Next, a method of manufacturing the semiconductor device 1 will be described with reference to FIGS. 2A to 6A and FIGS. 2B to 6B.

Figure 2A:
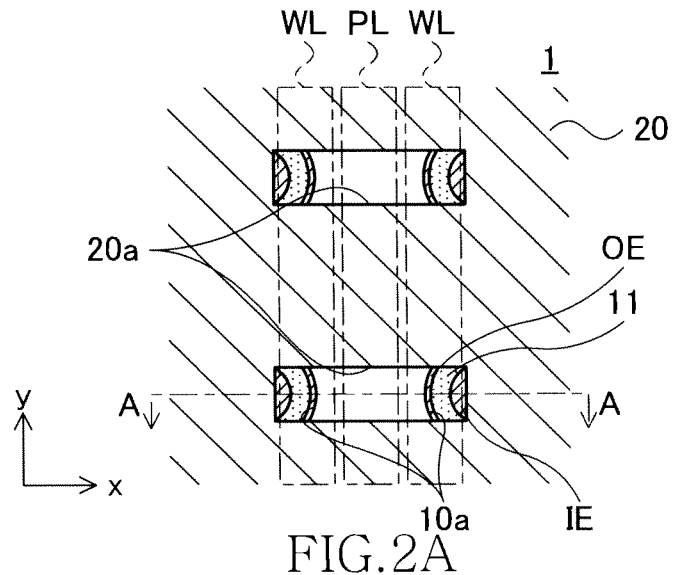
FIGS. 2A, 3A, 4A, 5A, 6A, and 9A are plan views of a semiconductor device 1 in the process of manufacturing.
Figure 2B:
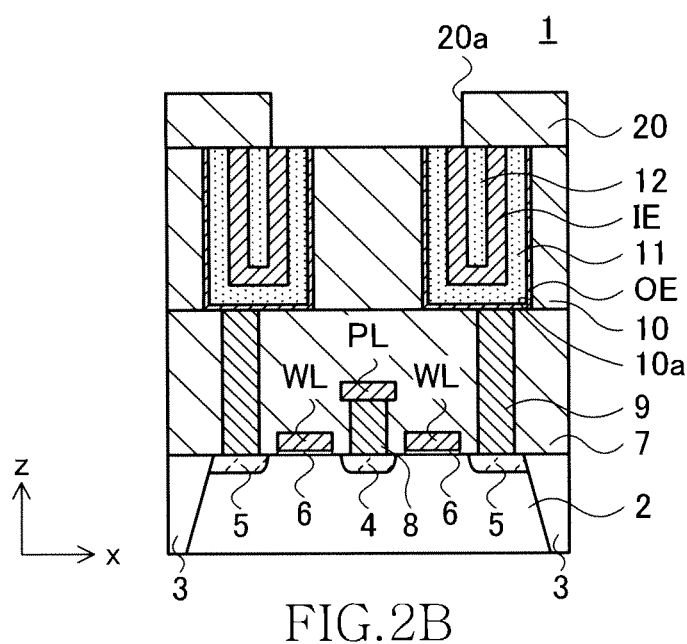

Initially, as shown in FIGS. 2A and 2B, element isolation regions 3, impurity diffusion regions 4 and 5, gate insulation films 6, word lines WL, and a part of an interlayer insulation film 7 made of silicon oxide (the part lying below the bottom surface of the plate wiring PL) are formed in/on the surface of a substrate 2. Through holes for exposing the top surfaces of the impurity diffusion regions 4 are formed in part of the interlayer insulation film 7. The through holes are filled with a conductive material to form contact plugs 8. Next, plate wiring PL is formed in contact with the top surfaces of the contact plugs 8, and the rest of the interlayer insulation film 7 is further deposited. Subsequently, through holes for exposing the top surfaces of the impurity diffusion regions 5 are formed in the interlayer insulation film 7. The through holes are filled with a conductive material to form storage node contact plugs 9.

Next, the surface of the interlayer insulation film 7 is flattened. An interlayer insulation film 10 (first interlayer insulation film) made of silicon oxide is deposited on the flattened surface. Through holes 10a for exposing the top surfaces of the storage node contact plugs 9 are formed in the interlayer insulation film 10. The through holes 10a are formed in pairs so as to lie at both longitudinal ends of active regions K whose longitudinal direction is the x direction. The through holes 10a are suitably formed by using lithography and dry etching techniques. The through holes 10a are formed for the respective storage node contact plugs 9. As an etching stopper film for use in dry etching the through holes 10a, a silicon nitride film is desirably formed in advance between the interlayer insulation film 7 and the interlayer insulation film 10.

After the formation of the through holes 10a, a conductive material, an insulating material, a conductive material, and an insulating material are deposited in order on the entire surface of the substrate 2. Preferred examples of the conductive materials to be deposited include metal materials such as tungsten. Preferred examples of the insulating materials include a silicon nitride film. The amounts of deposition of the materials are set so that the through holes 10a still have a space inside even after the second deposition of the conductive material, and the space is filled up by the final deposition of the insulating material. Specifically, if the through holes 10a have a diameter of 80 nm, the films of the conductive material, insulating material, and conductive material are preferably deposited in thicknesses (sidewall thicknesses) of 5 nm, 15 nm, and 10 nm, respectively. Consequently, the space to be filled with the last insulating material (fill-in insulation film 12) is 20 nm in diameter. If the through holes 10a have a different diameter, the dimensions may be changed accordingly.

Next, the surface of the article is flattened. The flattening is suitably performed by polishing and etchback using chemical mechanical polishing (CMP). As a result of the foregoing steps, as shown in FIG. 2B, there are formed outer electrodes OE, buffer insulation films 11, inner electrodes IE, and fill-in insulation films 12. The outer electrodes OE are conductive films of closed-bottomed cylindrical shape, formed along the inner walls of the through holes 10a. The buffer insulation films 11 are insulation films of closed-bottomed cylindrical shape, formed along the inner walls (the surfaces closer to the center axes of the through holes 10a) of the outer electrodes OE. The inner electrodes IE are conductive films of closed-bottomed cylindrical shape, formed along the inner walls (the surfaces closer to the center axes of the through holes 10a) of the buffer insulation films 11. The fill-in insulation films 12 are insulation films of pillar shape, formed along the inner walls (the surfaces closer to the center axes of the through holes 10a) of the inner electrodes IE.

Next, an interlayer insulation film 20 (second interlayer insulation film) made of a silicon oxide film is formed on the flattened surface. Openings 20a for exposing part of the top surfaces of the buffer insulation films 11 are formed in the interlayer insulation film 20. The openings 20a have a rectangular shape that is long in the x direction. As shown in FIG. 2A, the openings 20a are formed in positions where two phase change storage elements in the same active region are both exposed in part.

The openings 20a are formed by photolithography and etching. In the present embodiment, the width of the openings 20a in the x direction is such that the inner electrodes IE of both the phase change storage elements are exposed in part but the buffer insulation films 11 are not exposed on the sides where the pair of through holes 10 do not face each other. The width of the openings 20a in the y direction has the same value as the minimum feature size.

Figure 3A:
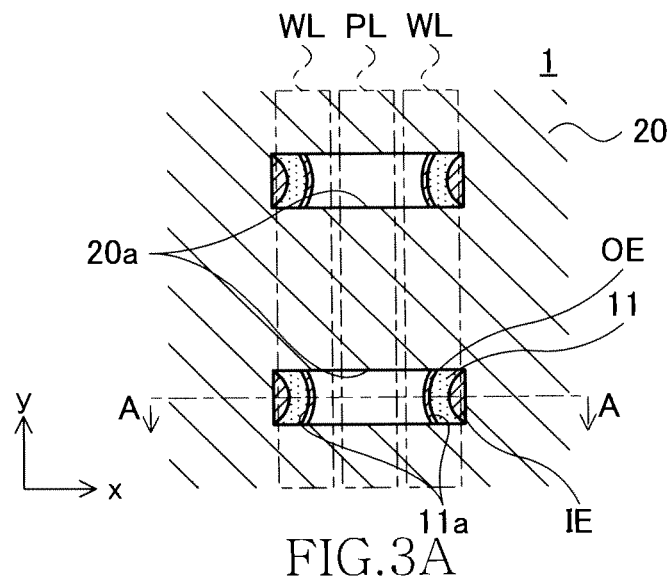
Figure 3B:
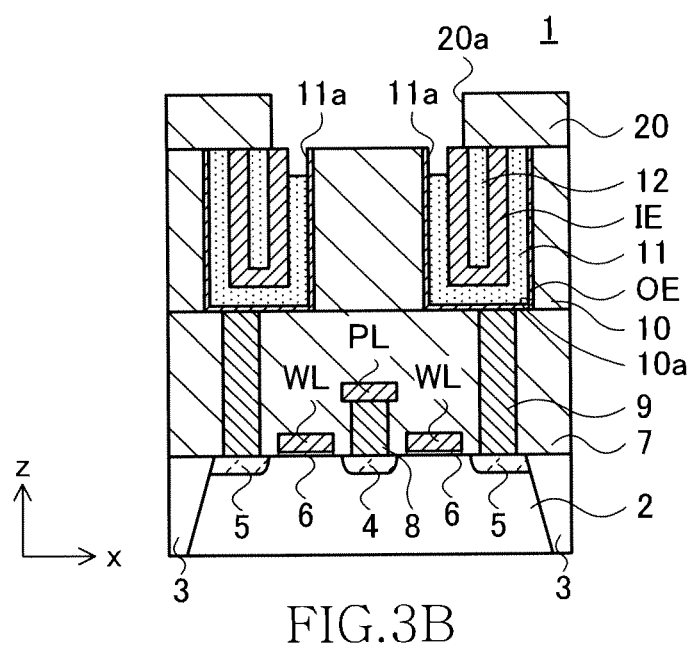

Subsequently, as shown in FIGS. 3A and 3B, the silicon nitride films are etched to form recesses 11a in the upper ends of the buffer insulation films 11 whose surfaces are exposed on the sides where the pair of through holes 10a face each other. The recesses 11a are formed in positions that at least overlap a line that connects the centers of the pair of through holes 10a. The etching is performed by highly selective etching, with a relatively high etching rate to silicon nitride films and a relatively low etching rate to silicon oxide films and to the conductive materials that constitute the inner electrodes IE and the outer electrodes OE. In order to prevent a plurality of recesses 11a to be filled with phase change films from varying in volume, the sidewalls of the recesses 11a need to be perpendicularly etched. For that purpose, known plasma-based anisotropic dry etching techniques are used.

Silicon nitride films are typically dry etched by using fluorine-containing plasma (fluorocarbon gas plasma) utilizing a $CF_4$ and such as a source gas. But such fluorocarbon gas plasma can also etch silicon oxide films at the same rate as the silicon nitride films, and thus it is difficult to etch only silicon nitride films with high selectivity. Then, the present embodiment uses fluoromethane gas in order to etch silicon nitride films with high selectivity over silicon oxide films. Examples include $CH_3F$ (fluoromethane) and $CH_2F_2$ (difluoromethane). Such gases contain H. The H reacts with nitrogen (N) that constitutes the silicon nitride films to form NH compounds for effective removal of N. This contributes to highly selective etching of the silicon nitride films. Anisotropic dry etching using such gas plasma can provide an etching selectivity of at least 50 to silicon nitride films over silicon oxide films. Consequently, even if silicon nitride films are etched into an etching depth of 50 nm, silicon oxide films are etched by 1 nm or so, i.e., can be maintained in a substantially unetched state. In the present embodiment, the etching depth may be set to 20 nm. Aside from the silicon oxide films (interlayer insulation film 10), there are also exposed metal films in the etching. The exposure does not matter since metal films are immune to fluorine-based etching.

Figure 4A:
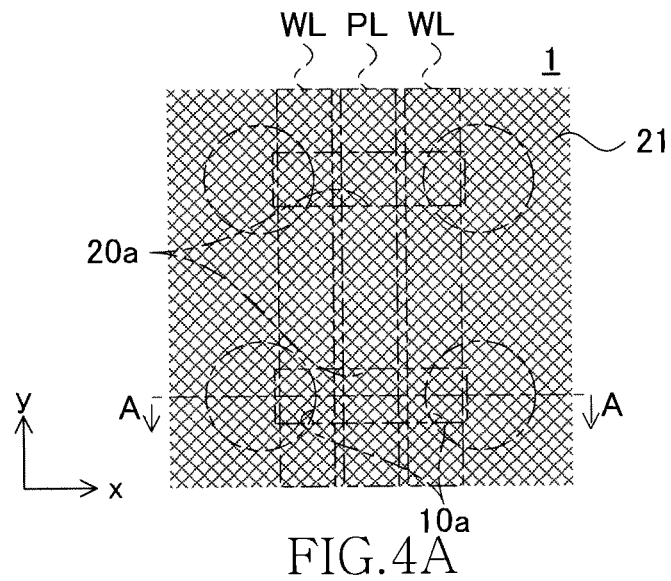
Figure 4B:
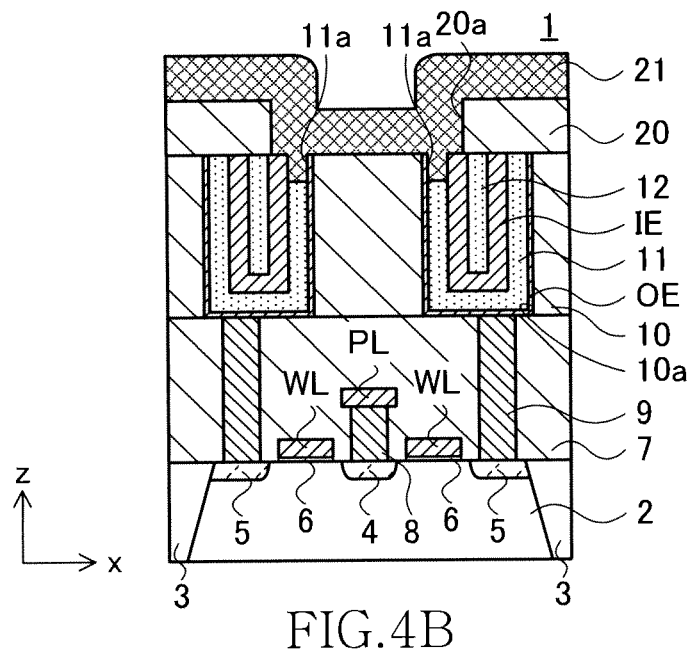

After the formation of the recesses 11a, as shown in FIGS. 4A and 4B, a phase change material 21 is deposited on the entire surface. The deposition is preferably performed by chemical vapor deposition (CVD). The amount of deposition of the phase change material 21 here needs to be as much as at least the recesses 11a can be filled up. In fact, as shown in FIG. 4B, the phase change material 21 is preferably deposited thicker.

Figure 5A:
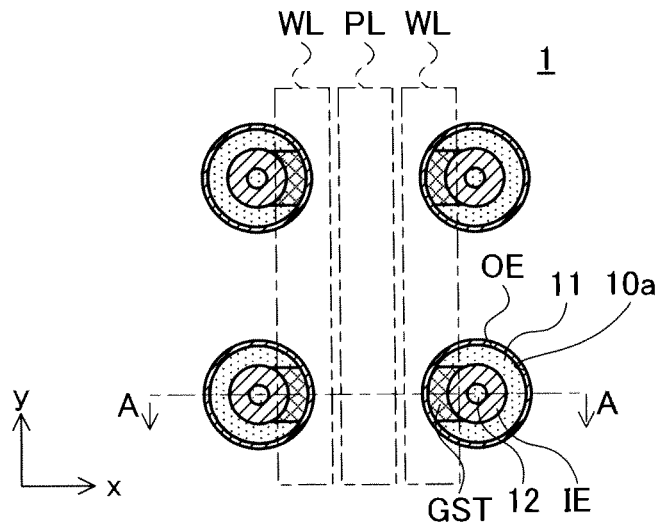
Figure 5B:
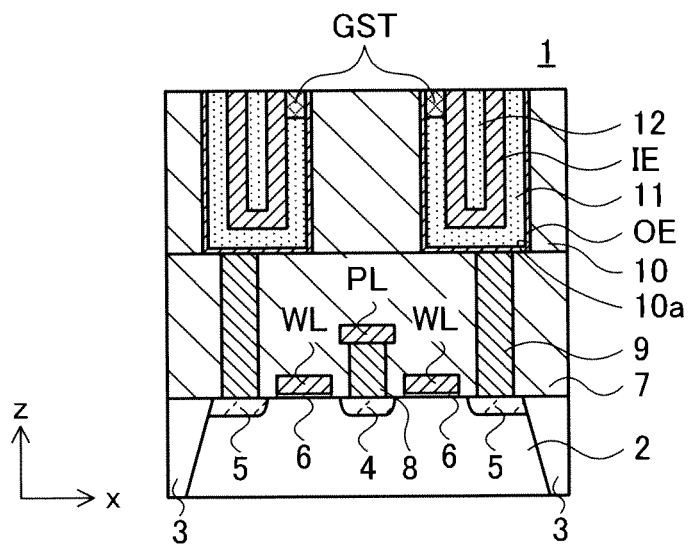

Next, as shown in FIGS. 5A and 5B, the surface is flattened down to the position of the bottom surface of the second interlayer insulation film 20. The flattening is also suitably performed by CMP-based polishing and etchback. The flattening leaves the phase change material 21 only in the recesses 11a, which constitute the phase change films GST. The second interlayer insulation film 20 is completely removed.

Figure 6A:
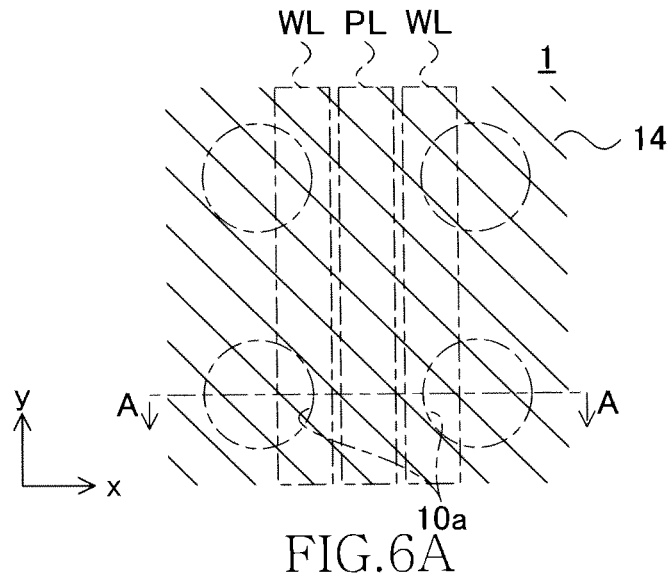
Figure 6B:
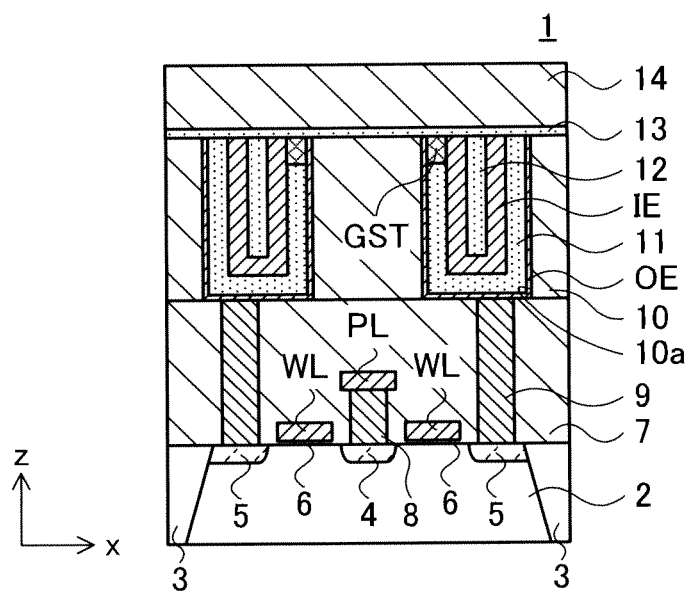

Subsequently, as shown in FIGS. 6A and 6B, an interlayer insulation film 13 made of a silicon nitride film is deposited on the entire surface. An interlayer insulation film 14 made of a silicon oxide film is further deposited thereon. The interlayer insulation films 13 and 14 preferably have a thickness of 10 nm and 50 nm, respectively. Then, as shown in FIG. 1B, through holes 15a for exposing the inner electrodes IE are formed in the interlayer insulation films 13 and 14. The through holes 15a are formed for the respective memory cells.

To form the through holes 15a, photolithography and dry etching are initially performed to form through holes in the interlayer insulation film 14. The dry etching is highly selective etching with a relatively high etching rate to silicon oxide films and a relatively low etching rate to silicon nitride films. The purpose of the use of highly selective etching is so that some over-etching can be performed to reliably form the through holes without corroding the inner electrodes IE and the like. After the formation of the through holes in the interlayer insulation film 14, the silicon nitride film (part of the interlayer insulation film 13) exposed at the bottoms of the through holes is removed by etching. This completes the through holes 15a which expose the inner electrodes IE at the bottom. In a plan view, the through holes 15a are preferably located so as not to expose the outer electrodes OE or the phage change films GST. Specifically, as shown in FIG. 1B, each through hole 15a is located over the range from the farthest side of the inner electrode IE from the phase change film GST to the top surface of the fill-in insulation film 12.

After the formation, the through holes 15a are filled with a conductive material. The filling is preferably performed by CVD. A preferred filling conductive material is tungsten. As a liner film, a titanium nitride film may be formed by CVD under the tungsten layer. The surface is then flattened again to form the bit line contact plugs 15 shown in FIGS. 1A and 1B. Bit lines BL are formed in contact with the top surfaces of the bit line contact plugs 15 to complete the semiconductor device 1.

As has been described above, according to the present manufacturing method, it is possible to manufacture the semiconductor device 1 shown in FIGS. 1A and 1B.

Figure 7A:
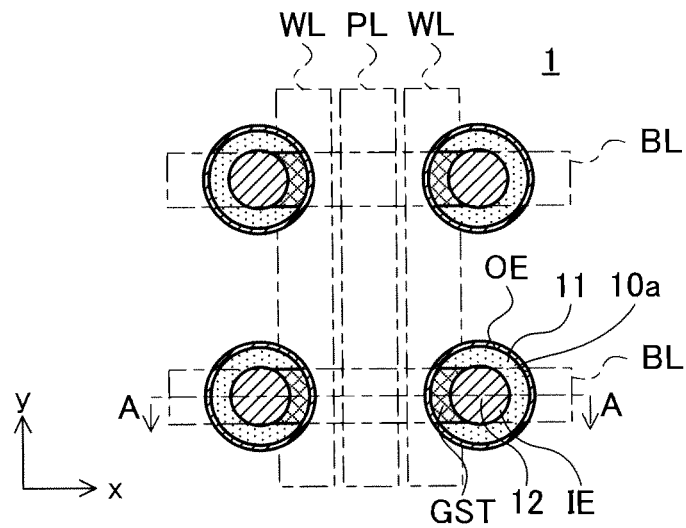
Figure 7B:
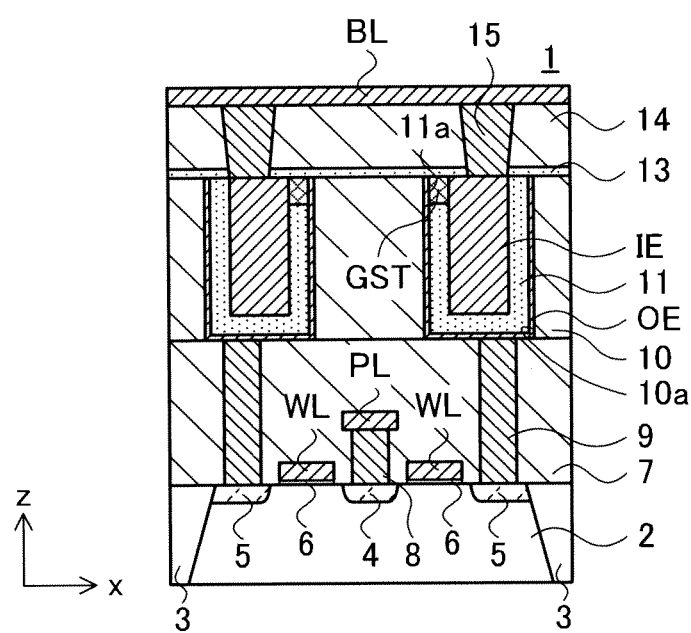

Turning to FIGS. 7A and 7B which are diagrams showing the configuration of a semiconductor device 1 according to a first modification of the preferred first embodiment of the present invention. In FIG. 7A, structures other than phase change storage elements are shown transparent.

The present modification is a modification to the shape of the inner electrodes IE. Specifically, in the present modification, the fill-in insulation films 12 are replaced with the same material as that of the inner electrodes IE. Consequently, as shown in FIGS. 7A and 7B, the inner electrodes IE according to the present modification are conductive films of pillar shape, not closed-bottomed cylindrical shape.

According to the present modification, the inner electrodes IE have a greater cross-sectional area. This can provide greater connection margins between the bit line contact plugs 15 and the inner electrodes IE.

Figure 8A:
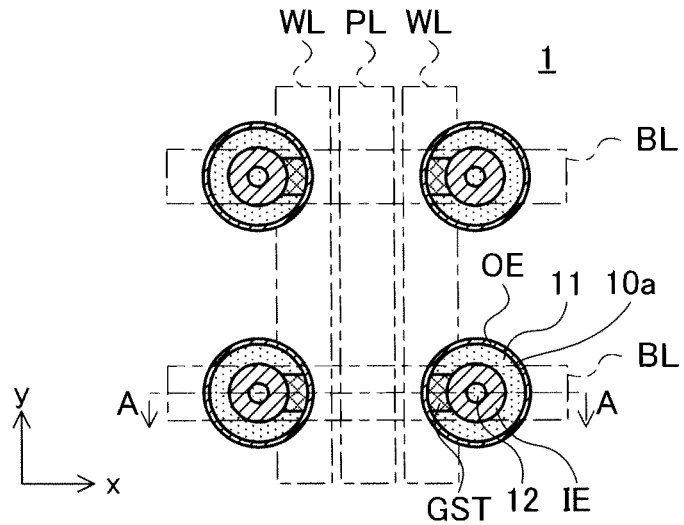
Figure 8B:
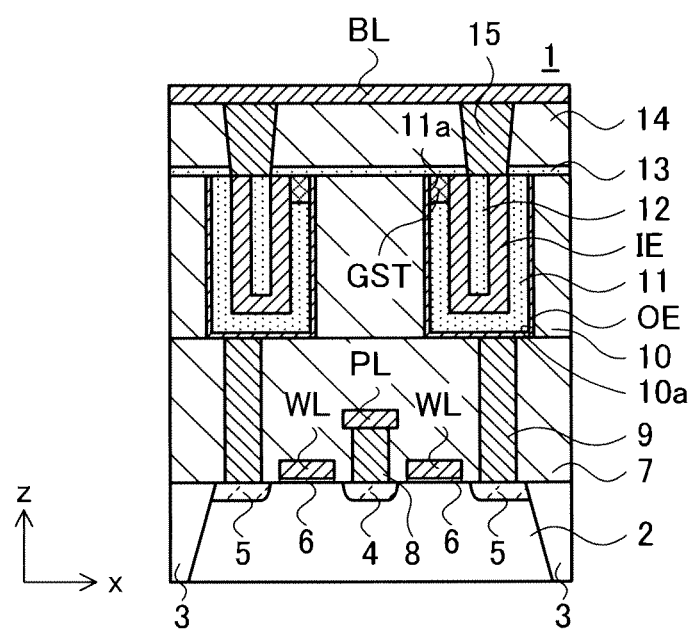

Turning to FIGS. 8A and 8B which are diagrams showing the configuration of a semiconductor device 1 according to a second modification of the preferred first embodiment of the present invention. In FIG. 8A, structures other than phase change storage elements are shown transparent.

The present modification is intended to make the width of the phase change films GST in the y direction smaller than the minimum feature size. As described previously, the first embodiment has dealt with the case where the width of the phase change films GST in the y direction is the minimum feature size. In the present modification, a sidewall insulation film is formed to cover the inside walls of the openings 20a, whereby the width of the openings 20a in the y direction is substantially reduced. Detailed description will be given below.

Figure 9A:
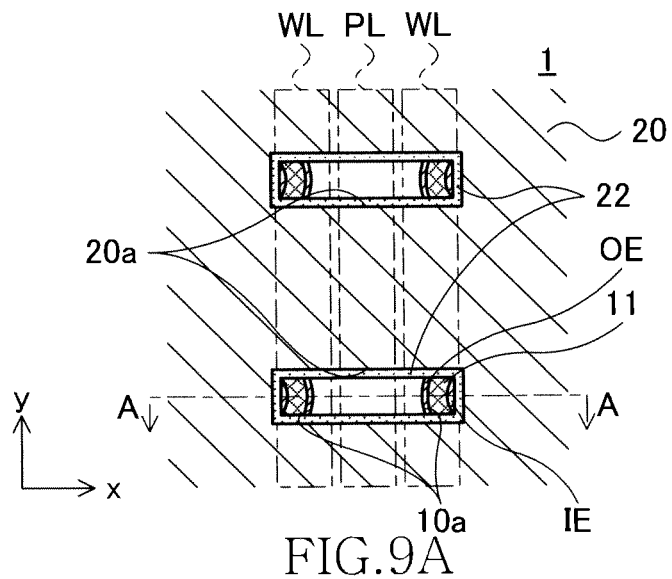
Figure 9B:
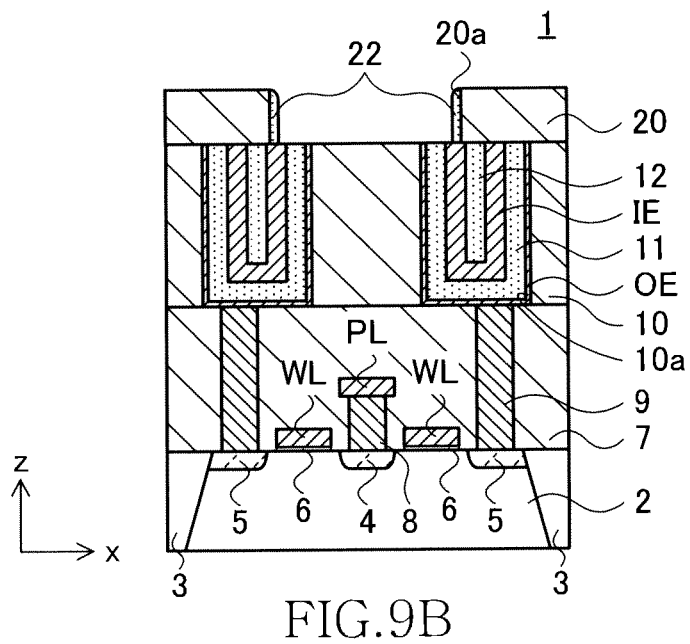

As shown in FIGS. 9A and 9B, in the present modification, a sidewall insulation film 22 made of a silicon nitride film is formed on the inside walls of the openings 20a. The etching of the buffer insulation films 11, which has been described with reference to FIGS. 3A and 3B, is performed after the formation of the sidewall insulation film 22. As a result, the width of the recesses 11a in the y direction decreases as much as the sidewall insulation film 22. The phase change films GST formed in the recesses 11a therefore have a smaller width in the y direction than the minimum feature size as much as the sidewall insulation film 22.

According to the present modification, it is possible to further reduce the contact areas between the phase change films GST and the outer electrodes OE, or heater electrodes. This can reduce the amount of current for writing the phase change films GST.

Figure 10A:
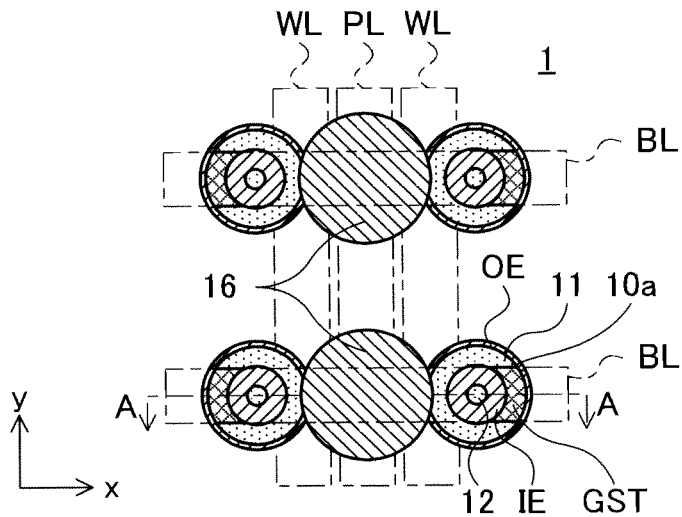
Figure 10B:
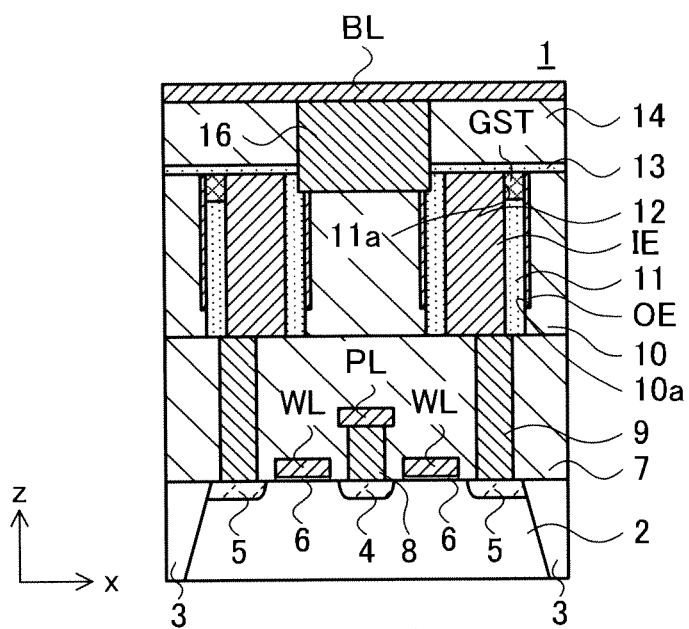

Turning to FIGS. 10A and 10B which are diagrams showing the configuration of a semiconductor device 1 according to a preferred second embodiment of the present invention. In FIG. 10A, structures other than phase change storage elements and bit line contact plugs are shown transparent.

The semiconductor device 1 according to the present embodiment is different from the semiconductor device 1 according to the first modification (FIG. 7) of the first embodiment in the following aspects. The outer electrodes OE and the buffer insulation films 11 are films of bottomless cylindrical shape, and the inner electrodes IE are conductive films of pillar shape. The inner electrodes IE are exposed downward (toward the substrate 2) at the bottom. The phase change films GST are formed in the upper ends of the buffer insulation films 11 in positions farther from the other phase change storage elements in the same active region. The bit line contact plugs 15 are replaced by bit line contact plugs 16 that are each common to two memory cells in the same active region.

In the semiconductor device 1 according to the present embodiment, it is the outer electrodes OE that are connected to the bit lines BL through the bit line contact plugs 16. The inner electrodes IE are connected to the cell transistors through the storage node contact plugs 9. The bottom surfaces of the outer electrodes OE are located slightly above the bottom surfaces of the inner electrodes IE so as to avoid contact with the storage node contact plugs 9.

With the foregoing configuration, the semiconductor device 1 according to the present embodiment can also reduce the contact areas between the heater electrodes and the phase change material like the first embodiment.

Next, a method of manufacturing the phase change storage elements in the semiconductor device 1 according to the present embodiment will be briefly described.

In the case of the first embodiment, a conductive material (outer electrode OE), a silicon nitride film (buffer insulation film 11), a conductive material (inner electrode IE), and an insulating material (fill-in insulation film 12) are deposited in order in each through hole 10a. In the present embodiment, a silicon oxide film and a conductive material to be an outer electrode OE are initially deposited in order in each through hole 10a. Anisotropic etching is performed to remove only the horizontal portions of the deposited films at the bottom. Next, a silicon nitride film to be a buffer insulation film 11 is deposited in the through hole 10a. Anisotropic etching is performed to remove only the horizontal portion at the bottom. Finally, the through hole 10a is filled with a conductive material that forms an inner electrode IE.

Next, the surface is flattened before recesses 11a are formed in the buffer insulation films 11 where to form the phase change films GST. The recesses 11a are filled with a phase change material, followed by surface flattening. Consequently, phase change storage elements having the shape shown in FIG. 10B are obtained.

As has been described above, according to the present manufacturing method, it is possible to manufacture the phase change storage elements of the present embodiment. The other portions of the semiconductor device 1 according to the present embodiment can be manufactured by the same manufacturing method as that described in the first embodiment.

It is apparent that the present invention is not limited to the above embodiments, but may be modified and changed without departing from the scope and spirit of the invention.

For example, the semiconductor device 1 according to the second embodiment may use the same fill-in insulation films 12 as those of the first embodiment. This can suppress the heater sink effect of the inner electrodes IE for improved heating efficiency.

What is claimed is:

1. A semiconductor device comprising:
    an interlayer insulation film having a first through hole; and
    a first phase change storage element provided in the first through hole, the first phase change storage element including:
        a first outer electrode of a cylindrical shape covering an inner wall of the first through hole;
        a first buffer insulation film of a cylindrical shape covering an inner wall of the first outer electrode, the first buffer insulation film having a first recess exposing a first portion of the inner wall of the first outer electrode;
        a first phase change film having one and opposite surfaces, the first phase change film filling the first recess so that the one surface of the first phase change film is in contact with the first portion; and
        a first inner electrode covering an inner wall of the first buffer insulation film and the opposite surface of the first phase change film.

2. The semiconductor device as claimed in claim 1, further comprising a first cell transistor, wherein
    the first outer electrode having a closed-bottom cylindrical shape,
    the first buffer insulation film having a closed-bottomed cylindrical shape, and
    the first outer electrode is electrically connected to a controlled electrode of the first cell transistor.

3. The semiconductor device as claimed in claim 2, further comprising a bit line extending in the first direction,
    wherein the first inner electrode is electrically connected to the bit line.

4. The semiconductor device as claimed in claim 3, wherein
    the interlayer insulation film further has a second through hole provided adjacent to the first through hole in the first direction,
    the semiconductor device further comprises a second phase change storage element provided in the second through hole, the second phase change storage element including:
        a second outer electrode of a closed-bottomed cylindrical shape covering an inner wall of the second through hole;
        a second buffer insulation film of a closed-bottom cylindrical shape covering an inner wall and bottom wall of the second outer electrode, the second buffer insulation film having a second recess exposing a second portion of the inner wall of the second outer electrode;
        a second phase change film having one and opposite surfaces, the second phase change film filling the second recess so that the one surface of the second phase change film is in contact with the second portion; and
        a second inner electrode covering an inner wall of the second buffer insulation film and the opposite surface of the second phase change film,
    the semiconductor device further comprises first and second bit line contract plugs being in contact with the first and second inner electrodes, respectively, and
    the bit line is in contract with the first and second bit line contact plug.

5. The semiconductor device as claimed in claim 4, wherein
    the interlayer insulation film further has a third through hole provided adjacent to the first through hole in a second direction that is different from the first direction,
    the semiconductor device further comprises a third phase change storage element provided in the third through hole, the third phase change storage element including:
        a third outer electrode of a closed-bottomed cylindrical shape covering an inner wall of the third through hole;
        a third buffer insulation film of a closed-bottomed cylindrical shape covering an inner wall and bottom wall of the third outer electrode, the third buffer insulation film having a third outer electrode;
        a third phase change film having one and opposite surfaces, the third phase change film filling the third recess so that the one surface of the third phase change film is in contact with the third portion; and
        the third inner electrode covering an inner wall of the third buffer insulation film and the opposite surface of the third phase change film,
    the semiconductor device further comprises a third cell transistor and a word line extending in the second direction,
    the third outer electrode is electrically connected to a controlled electrode of the third cell transistor, and
    the word line constitutes control electrodes of the first and third cell transistors.

6. The semiconductor device as claimed in claim 1, further comprising a first cell transistor, wherein
    the first outer electrode having a bottomless cylindrical shape,
    the first buffer insulation film having a bottomless cylindrical shape, and
    the first inner electrode is electrically connected to a controlled electrode of the first cell transistor.

7. The semiconductor device as claimed in claim 6, further comprising a bit line extending in the first direction,
    wherein the first outer electrode is electrically connected to the bit line.

8. The semiconductor device as claimed in claim 7, wherein
    the interlayer insulation film further has a second through hole provided adjacent to the first through hole in the first direction,
    the semiconductor device further comprises a second phase change storage element provided in the second through hole, the second phase change storage element including:
        a second outer electrode of a bottomless cylindrical shape covering an inner wall of the second through hole;
        a second buffer insulation film of a bottomless cylindrical shape covering an inner wall of the second outer electrode, the second buffer insulation film having a second recess exposing a second portion of the inner wall of the second outer electrode;

a second phase change film having one and opposite surfaces, the second phase change film filling the second recess so that the one surface of the second phase change film is in contact with the second portion; and a second inner electrode covering an inner wall of the second buffer insulation film and the opposite surface of the second phase change film, the semiconductor device further comprises a bit line contact plug being arranged between the first through hole and the second through hole, the bit line contact plug being in contact with the first and second outer electrodes, and the bit line is in contact with the bit line contact plug.

9. The semiconductor device as claimed in claim 8, wherein the interlayer insulation film further has a third through hole provided adjacent to the first through hole in a second direction that is different from the first direction, the semiconductor device further comprises a third phase change storage element provided in the third through hole, the third phase change storage element including:

a third outer electrode of a bottomless cylindrical shape covering an inner wall of the third through hole;

a third buffer insulation film of a bottomless cylindrical shape covering an inner wall of the third outer electrode, the third buffer insulation film having a third recess exposing a third portion of the inner wall of the third outer electrode;

a third phase change film having one and opposite surfaces, the third phase change film filling the third recess so that the one surface of the third phase change film is in contact with the third portion; and a third inner electrode covering an inner wall of the third buffer insulation film and the opposite surface of the third phase change film, the semiconductor device further comprises a third cell transistor and a word line extending in the second direction, the third inner electrode is electrically connected to a controlled electrode of the third cell transistor, and the word line constitutes control electrodes of the first and third cell transistors.

10. The semiconductor device as claimed in claim 1, wherein the first inner electrode having a closed-bottomed cylindrical shape to form an inner space, and the first phase change storage element further includes a fill-in insulation film filing the inner space.

11. The semiconductor device as claimed in claim 1, wherein the first inner electrode has a pillar shape.

12. The semiconductor device as claimed in claim 5, wherein the first phase change film has a width smaller than a minimum feature size in the second direction.

13. A semiconductor device comprising:
a semiconductor substrate;
a insulation film formed over the semiconductor substrate;
a phase change film formed on a top surface of the insulation film, the phase change film having a bottom surface contacting to the insulation film;
a first electrode formed on a first side surface of the insulation film and a first side surface of the phase change film; and
a second electrode formed on a second side surface of the insulation film and a second side surface of the phase change film.

14. The semiconductor device as claimed in claim 13, wherein the first and second side surfaces of the insulation film are in alignment with the first and second side surfaces of the phase change film, respectively.

15. The semiconductor device as claimed in claim 14, wherein a width of the insulation film is as same as a width of the phase change film, in a direction parallel to a top surface of the semiconductor substrate where plural transistors are formed.

\* \* \* \* \*